United States Patent
Vischer

(10) Patent No.: US 7,159,751 B2
(45) Date of Patent: Jan. 9, 2007

(54) WIRE BONDER

(75) Inventor: Dieter Vischer, Zug (CH)

(73) Assignee: ESEC Trading SA, Cham (CH)

( * ) Notice: Subject to any disclaimer, the term of this patent is extended or adjusted under 35 U.S.C. 154(b) by 21 days.

(21) Appl. No.: 10/853,328

(22) Filed: May 25, 2004

(65) Prior Publication Data

US 2004/0245314 A1 Dec. 9, 2004

(30) Foreign Application Priority Data

Jun. 6, 2003 (CH) ................................ 1007/03

(51) Int. Cl.
*B23K 37/04* (2006.01)

(52) U.S. Cl. .......................... 228/4.5; 228/45
(58) Field of Classification Search ................ 228/4.5, 228/45, 112.1, 2.1, 180.5, 25
See application file for complete search history.

(56) References Cited

U.S. PATENT DOCUMENTS

| | | | |
|---|---|---|---|
| 2,900,830 A * | 8/1959 | Kuno et al. .................... 74/103 |
| 3,256,007 A * | 6/1966 | Hunsaker .................... 267/66 |
| 3,363,474 A * | 1/1968 | Hans et al. .................... 74/52 |
| 3,653,268 A * | 4/1972 | Diepeveen .................... 74/55 |
| 4,040,885 A * | 8/1977 | Hight et al. .................. 156/378 |
| 4,538,047 A * | 8/1985 | Nakano et al. .......... 219/125.1 |
| 5,114,302 A | 5/1992 | Meisser et al. |
| 5,154,022 A * | 10/1992 | Chalco et al. ................. 451/36 |
| 5,182,967 A * | 2/1993 | Yoshizawa et al. ........... 74/834 |
| 5,246,513 A * | 9/1993 | Yoshida et al. ............... 156/64 |
| 5,330,089 A | 7/1994 | Orcutt et al. |
| 5,667,130 A * | 9/1997 | Morita et al. ............. 228/110.1 |
| 5,732,599 A * | 3/1998 | Iriyama ................... 74/490.02 |
| 5,797,666 A | 8/1998 | Park |
| 5,893,509 A * | 4/1999 | Pasquier ...................... 228/4.5 |
| 5,971,254 A * | 10/1999 | Naud et al. ............... 228/180.5 |
| 6,398,098 B1 * | 6/2002 | Kada .......................... 228/4.5 |
| 6,460,751 B1 | 10/2002 | Thürlemann |
| 6,516,990 B1 | 2/2003 | Hess et al. |

* cited by examiner

*Primary Examiner*—Jonathan Johnson
(74) *Attorney, Agent, or Firm*—McCormick, Paulding & Huber LLP

(57) ABSTRACT

The bondhead of a Wire Bonder, that serves to produce a wire connection between two connection points by means of a capillary guiding a wire, is formed as a pantograph mechanism. The pantograph mechanism comprises a first swivel arm driven by a first motor, a second swivel arm driven by a second motor and two connecting arms. With this pantograph mechanism, the movement of the capillary takes place by means of rotary movements.

6 Claims, 1 Drawing Sheet

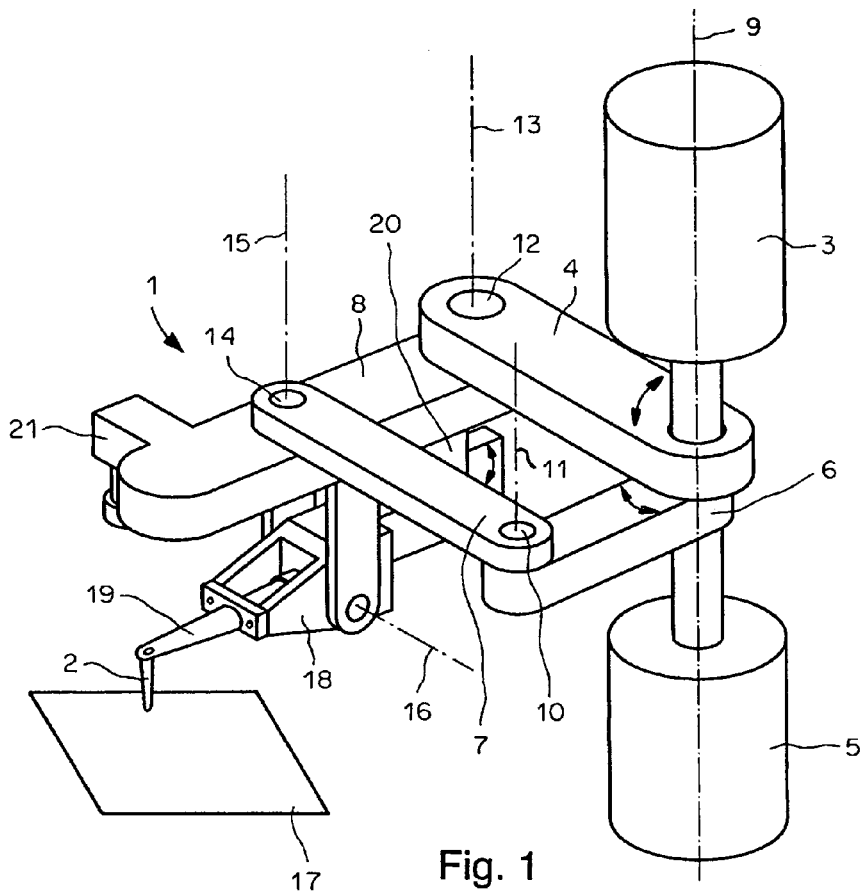
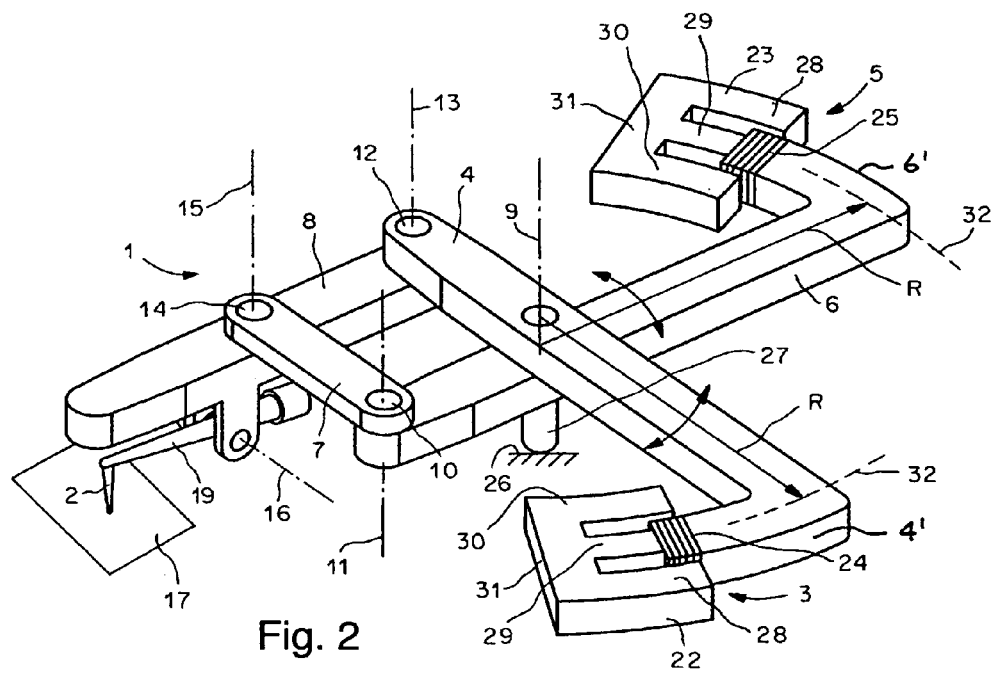

WIRE BONDER

PRIORITY CLAIM

The present application claims priority under 35 U.S.C § 119 based upon and incorporates by reference Swiss Patent Application No. 2003 1007/03 filed on Jun. 6, 2003.

FIELD OF THE INVENTION

The invention concerns a Wire Bonder.

BACKGROUND OF THE INVENTION

A Wire Bonder is a machine with which semiconductor chips are wired after mounting on a substrate. The Wire Bonder has a capillary that is clamped to the tip of a horn. The capillary serves to secure the wire to a connection point on the semiconductor chip and to a connection point on the substrate as well as to guide the wire between the two connection points. On producing the wire connection between the connection point on the semiconductor chip and the connection point on the substrate, the end of the wire protruding out of the capillary is first melted into a ball. Afterwards, the wire ball is secured to the connection point on the semiconductor chip by means of pressure and ultrasonics. In doing so, ultrasonics is applied to the horn from an ultrasonic transducer. This process is called ball bonding. The wire is then pulled through to the required length, formed into a wire loop and welded to the connection point on the substrate. This last part of the process is called wedge bonding. After securing the wire to the connection point on the substrate, the wire is torn off and the next bonding cycle can begin.

Most of the Wire Bonders available on the market today move the bondhead in the horizontal xy plane by means of two orthogonally arranged drives. An example of such a drive system is disclosed for example in the patent specification U.S. Pat. No. 5,114,302. In addition, this drive system uses vacuum pre-charged air bearings. A significant disadvantage of this known Wire Bonder exists in that on moving the bondhead to a new position, relatively large masses have to be accelerated. This requires powerful drive systems and robust bearings. A further disadvantage exists in that, depending on the position of the bondhead, on accelerating the bondhead relatively large torques occur that place great demands on the bearing of the bondhead. This puts limitations on the maximum possible acceleration values and therefore on the throughput of the Wire Bonder.

A Wire Bonder with which the movement of the bondhead takes place with a polar drive system is known from the patent specification U.S. Pat. No. 5,330,089. With this drive system relatively large masses also have to be accelerated. In addition, the load to be accelerated by the turning motion of the motor is dependent on the position of the load in relation to the linear axis which, on the one hand impedes the regulation of the movement of the bondhead and, on the other hand puts limitations on the maximum possible acceleration values.

A Wire Bonder with which the movement of the bondhead takes place with a rotary drive system is known from the patent specification U.S. Pat. No. 6,460,751. This drive system has a linear axis that has to accelerate a relatively large mass and a rotary axis that has to accelerate a relatively small mass.

SUMMARY OF THE INVENTION

The object of the invention is to develop a Wire Bonder that enables the fastest possible movement of the capillary.

In accordance with the invention, it is suggested to form the bondhead of the Wire Bonder that serves to produce a wire connection between two connection points by means of a capillary guiding a wire, as a pantograph mechanism. The pantograph mechanism comprises a first swivel arm driven by a first motor, a second swivel arm driven by a second motor and two connecting arms. The first swivel arm and the second swivel arm can be turned on a first, stationary axis. The first connecting arm can be turned on a second axis that bears on an end of the second swivel arm away from the first axis. The second connecting arm can be turned on a third axis that bears on an end of the first swivel arm away from the first axis. The two connecting arms are rotatably connected on a fourth axis. With this pantograph mechanism, the movement of the capillary takes place by means of rotary movements. The advantage exists in that the largely symmetrical structure brings about similar loads for both motors, ie, there are two almost equally heavy axes and not one heavy and one light axis as with the rotary bondhead.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

In the drawings:

FIG. 1 shows a bondhead of a Wire Bonder according to a first embodiment of the invention, and FIG. 2 shows a bondhead of a Wire Bonder according to a second embodiment of the invention.

DETAILED DESCRIPTION OF THE PREFERRED EMBODIMENTS

FIG. 1 shows a perspective view of the bondhead 1 of a Wire Bonder according to a first embodiment of the invention. By means of a capillary 2 guiding a wire, the bondhead 1 serves to produce a wire connection between a connection point, a so-called bond pad, on a semiconductor chip and a connection point on a substrate. The bondhead 1 comprises a first swivel arm 4 driven by a first motor 3, a second swivel arm 6 driven by a second motor 5 and two connecting arms 7 and 8. The first swivel arm 4 and the second swivel arm 6 can both be turned on a same axis 9. The first motor 3 turns the first swivel arm 4 on the axis 9, the second motor 5 turns the second swivel arm 6 on the axis 9. The two motors 3 and 5 are mounted stationary on a not presented base of the Wire Bonder. The two swivel arms 4 and 6 and the two connecting arms 7 and 8 form a so-called pantograph mechanism: By means of a first bolt 10, the first connecting arm 7 can be rotated on an axis 11 bearing on the end of the second swivel arm 6 away from the axis 9, by means of a second bolt 12, the second connecting arm 8 can be rotated on an axis 13 bearing on the end of the first swivel arm 4 away from the axis 9, by means of a third bolt 14, the two connecting arms 7 and 8 are rotatably connected on a fourth axis 15. The distance between the axes 9 and 11 is equal to the distance between the axes 13 and 15, the distance between the axes 9 and 13 is equal to the distance between the axes 11 and 15.

The first connecting arm 7 therefore always runs parallel to the first swivel arm 4 and the second connecting arm 8 always runs parallel to the second swivel arm 6. The axes 9, 11, 13 and 15 run parallel to each other, preferably in the vertical direction. The turning movements of the two swivel arms 4 and 6 are indicated by arrows. The turning range of the two motors 3 and 5 and the length of the swivel arms 4 and 6 and the two connecting arms 7 and 8 determine the size of the working area 17 within which the capillary 2 can be moved.

A rocker 18 that can be turned on a horizontal axis 16 that carries a horn 19 to which ultrasonics from an ultrasonic transducer can be applied at the tip of which a capillary 2 is clamped is mounted on the second connecting arm 8. A motor 20 is arranged on the connecting arm 8 for the turning movement of the rocker 18. Also arranged on the second connecting arm 8 is a camera 21 or an optical system connected to a camera that serves to determine the position of the bond pad of the semiconductor chip or the substrate. An optical system that can determine the position of the tip of the capillary 2 in relation to a bond pad immediately before the capillary impacts on the bond pad, is known from the European patent application EP 1 174 906.

FIG. 2 shows a perspective view of the bondhead of a Wire Bonder according to a second embodiment of the invention. The difference to the first embodiment exists in that the motors 3 and 5 are linear motors that consist of a rigidly arranged stator 22 or 23 and a coil 24 or 25 mounted on the corresponding swivel arm 4 and 6. With this example, the two swivel arms 4 and 6 are elongated and have an end 4' and 6' bent at almost right angles that accommodates the coil 24 and 25. The swivel arms 4 and 6 bear on a bolt 27 mounted on the base 26 of the Wire Bonder. Suitable as linear motors are for example so-called voice coil motors the stator of which has an E-shaped magnetic yoke. The magnetic yoke consists of three bars 28, 29 and 30 that are connected by a connecting bar 31. The coil mounted on the swivel arm surrounds the middle bar 29 of the three bars. Because the movement of the coil takes place on a circular path 32, the centre of which is the axis 9, the bars 28, 29 and 30 are curved corresponding to the radius R of the circular path 32. The greater the radius R of the circular path, the smaller the stroke that the two linear motors have to have in order to cover a given working area 17 of the capillary 2. However, the smaller the stroke, the greater the demands on the positional accuracy of the two linear motors. With this example, the camera is not presented and the rocker 19 is only presented schematically.

With both embodiments, the position of the tip of the capillary within the working range of the bondhead 1 is defined by two angles, namely the angle α, that encompasses the first swivel arm 4 in relation to a first predetermined axis, and the angle β, that encompasses the second swivel arm 6 in relation to a second predetermined axis. The movement of the capillary 2 from a first point $A=(\alpha_1, \beta_1)$ defined by the angles $\alpha_1$ and $\beta_1$ to a second point $B=(\alpha_2, \beta_2)$ defined by the angles $\alpha 2$ and $\beta_2$ must be converted into co-ordinates $\alpha(t)$, $\beta(t)$ corresponding to the desired path, whereby the value t represents a parameter. The value t is for example the time, whereby the pair of co-ordinates $\alpha(t)$, $\beta(t)$ designate the position of the capillary 2 at time t.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A wire bonder comprising a bondhead with a capillary guiding a wire for making a wire connection between two connection points, the bondhead comprising
    a first swivel arm rotatably mounted on a first stationary axis,
    a first motor for rotating the first swivel arm,
    a second swivel arm rotatably mounted on the first stationary axis,
    a second motor for rotating the second swivel arm,
    a first connecting arm rotatably mounted on a second axis located at a first end of the second swivel arm away from the first axis, and
    a second connecting arm rotatably mounted on a third axis located at a first end of the first swivel arm away from the first axis, wherein the two connecting arms are rotatably mounted on a fourth axis, wherein the first stationary axis, the second axis, the third axis and the fourth axis run parallel to each other, and wherein the first swivel arm, the second swivel arm, the first connecting arm and the second connecting arm cooperate to form a pantographic mechanism.

2. The wire bonder according to claim 1, wherein the first swivel arm has a second end bent at almost right angles and the first motor is a linear motor that includes a stator and a coil arranged on the second end of the first swivel arm and wherein the second swivel arm has a second end bent at almost right angles and the second motor is a linear motor that includes a stator and a coil arranged on the second end of the second swivel arm.

3. The wire bonder according to claim 2, wherein the first motor is a voice coil motor with three bars, and wherein the bars are curved.

4. The wire bonder according to claim 1, further comprising a rocker mounted on the second connecting arm and rotatable on a horizontal axis, the rocker carrying a horn to which ultrasonics can be applied and at the tip of which the capillary is clamped.

5. The wire bonder according to claim 2, further comprising a rocker mounted on the second connecting arm and rotatable on a horizontal axis, the rocker carrying a horn to which ultrasonics can be applied and at the tip of which the capillary is clamped.

6. The wire bonder according to claim 3, further comprising a rocker mounted on the second connecting arm and rotatable on a horizontal axis, the rocker carrying a horn to which ultrasonics can be applied and at the tip of which the capillary is clamped.

* * * * *